April 25, 1967 A. A. VALDETTARO ET AL 3,316,363

MULTIPLE SECTION TUNER WITH IMPROVED STATOR AND ROTOR CONTACT STRUCTURE

Original Filed Oct. 20, 1960 5 Sheets-Sheet 1

United States Patent Office 3,316,363

Patented Apr. 25, 1967

3,316,363

MULTIPLE SECTION TUNER WITH IMPROVED STATOR AND ROTOR CONTACT STRUCTURE

Alarico A. Valdettaro and Joe G. Badger, Bloomington, Ind., and Stanley R. Meadows, deceased, late of Bloomington, Ind., by Rosetta Meadows, administratrix, Bloomington, Ind., assignors to Sarkes Tarzian, Inc., Bloomington, Ind., a corporation of Indiana Original application Oct. 20, 1960, Ser. No. 63,889, now Patent No. 3,234,801, dated Feb. 15, 1966. Divided and this application Feb. 14, 1966, Ser. No. 529,172

8 Claims. (Cl. 200—11)

The present invention is a division of our copending application Serial No. 63,889, filed Oct. 20, 1960 now Patent No. 3,234,801.

The present invention relates to tuners and, more particularly, to tuners suitable for use in radio and television receiving apparatus and the like.

Television tuners commonly in use today may be generally classified as being of two types. The first type is generally identified as a switch type tuner in which a number of switch wafers are employed for the various RF amplifier, mixer and oscillator portions of the tuner. Each of these switch wafers comprises a rotor and a stator, the stator carrying a number of stationary contacts between which are connected incremental inductances which may be selectively connected into the various portions of the tuner by means of the rotor switch contacts. The other type of tuner is generally known as a turret type tuner and employs a rotatable switching drum which carries a number of individual panels on which are positioned the tuning coils for the various portions of the tuner such as the RF amplifier oscillator, mixer and oscillator sections. This drum is rotated bodily by means of the main tuning shaft so that individual panels are selectively moved into engagement with a set of stationary contacts so that different tuning coils can be connected into the circuitry of the tuner.

In switch type tuners the rotor and stator contacts are usually provided with a suitable lubricant to facilitate the establishment of good wiping contact between the contacts and to minimize wear on these contacts. However, this lubricant dries up after a certain period of time and ceases to perform its intended function. Furthermore, duct and foreign particles may gather on the rotor and stator contacts with the result that faulty or intermittent switch contact action is produced. In addition, the conventional rotor and stator contacts are usually silver plated to lower the contact resistance and some difficulty is experienced due to tarnishing of these silver plated surfaces when exposed to the atmosphere. It is, therefore, an important object of the present invention to provide a new and improved tuner of the switch type in which the switch commutation area is protected from the surrounding environment.

It is a further object of the present invention to provide a new and improved switch type tuner in which the rotor and stator contacts of the individual switch wafers are completely enclosed and protected from the environment.

It is still another object of the present invention to provide a switch type tuner in which the rotor and stator contacts are protected by means of a series of tubular spacers which cooperate with the stator elements of the individual switch wafers to provide a substantially completely enclosed environment for the rotor and stator switch contacts while at the same time providing an arrangement which can be readily disassembled upon removal of the main tuning shaft.

It is also another object of the present invention to provide a new and improved tuner in which the switch contacts are contained in a substantially sealed housing in which a suitable tarnish retardant may be placed to inhibit tarnishing of the contacts.

It is a further object of the present invention to provide a new and improved switch type tuner which is adapted to receive VHF signals and can be readily adapted for reception of UHF signals in conjunction with a preceding UHF tuner.

It is a still further object of the present invention to provide a new and improved switch type tuner which can be manufactured on a standardized basis for use in receiving VHF signals alone or which may be readily adapted for reception of UHF signals in conjunction with a preceding UHF tuner by means of a suitable switch subassembly which can be readily inserted into the tuner proper.

In television tuners of both the switch type and the turret type, it is becoming increasingly important that the tuner occupy a minimum amount of space lengthwise of the tuner shaft due to the ever increasing demand for shallower, more compact television receivers. In many tuners of both types a fine tuning arrangement is employed which comprises a variable inductance having a movable core or plunger which is adjusted from the conventional fine tuning shaft which surrounds the main tuning shaft of the tuner. However, the fine tuning variable inductance is usually mounted in such a position that the movable core thereof is parallel to the main tuning shaft of the tuner with the result that the overall length of the tuner is substantially increased to accommodate such a variable inductance type of fine tuning. In addition, when the fine tuning variable inductance is so mounted, end play of the fine tuning shaft will result in undesired movement of the fine tuning inductance so that the setting of this inductance may vary in an undesirable manner. It is, therefore, a further important object of the present invention to provide a new and improved tuner in which a variable inductance type of fine tuning is employed without substantially increasing the overall length of the tuner.

It is another object of the present invention to provide a new and improved tuner in which end play of the fine tuning shaft does not affect the setting of a variable inductance type of fine tuning control in the tuner.

It is a still further object of the present invention to provide a new and improved tuner in which a variable inductance type of fine tuning is employed and wherein a safety arrangement is provided to prevent damage to the variable inductance at the limiting end positions thereof by forcing the fine tuning knob in these positions.

Briefly stated, the improved television tuner of the present invention includes a U-shaped chassis having a bight portion and a pair of upstanding end legs. For mounting the main tuning shaft, each of the end legs is provided with a V-shaped bearing surface against which the main tuning shaft is biased by means of a common torsion bar spring. This spring also bears against a detent of an index plate mounted on the main tuning shaft and hence serves the dual functions of angularly positioning the tuning shaft to the selected position and biasing the tuning shaft against the V-shaped bearing surfaces.

Fine tuning of the tuner is accomplished through a variable inductor having a movable core which is adjustable by an edge cam disc mounted concentrically with the main tuning shaft. Friction drive means are provided for preventing damage to the fine tuning inductor due to manual forcing of the fine tuning control beyond the limiting end positions of the impedance and including a lost motion means. The means for adjusting the cam includes detent means which provide the friction drive for the lost motion between the control means and the cam when the cam is in its extreme positions of adjustment of the impedance.

According to another aspect of the present invention, the tuner includes a plurality of switch wafer members and a plurality of hollow cylindrical spacer members are interposed between the wafers to provide an enclosed column type switch structure which protects the contacts of the switch wafers and spaces the wafers properly relative to one another and to the chassis. The spacer members and switch wafers are held in assembled relation by means of a spring clip which is positioned between the rear leg of the tuner chassis and the end of the switch assembly. However, this spring clip can be replaced by a UHF switch subassembly in the event it is desired to operate the tuner in conjunction with a preceding UHF tuner.

The invention, both as to its organization and method of operation, together with further objects and advantages thereof, will best be understood by reference to the following specification taken in connection with the accompanying drawings, in which.

Figure 1:
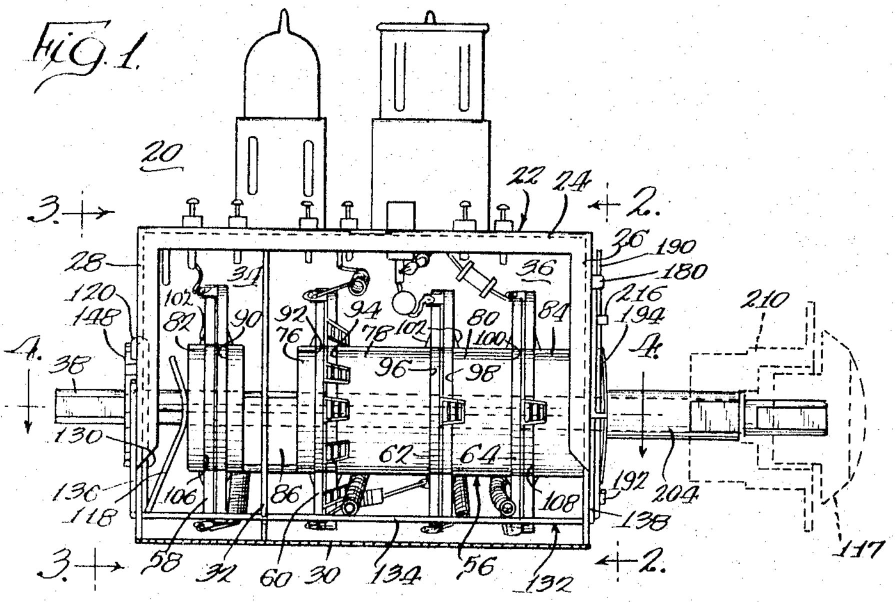
FIG. 1 is an elevational view of the improved tuner with a portion of the cover thereof removed.

Referring now to the drawings, and particularly to the embodiments of FIGS. 1 to 8 and 14 thereof, there is illustrated an improved high frequency television tuner 20, according to the present invention. The tuner includes a chassis 22 (FIGS. 1 and 7) of generally U-shape and having a bight portion 24 and a pair of upstanding end legs 26 and 28. A removable shield 30 normally encloses the open sides and bottom of the chassis 22. A shield partition 32 intermediate the end legs 26 and 28 divides the tuner into an R.F. section 34 and a mixer-oscillator section 36.

To provide for mounting of a main tuning shaft 38 in the chassis 22, the end legs 26 and 28 thereof are each provided with a bearing means 40 and 42, respectively, each of which includes a pair of bearing surfaces 44, 46 and 48, 50 which are arranged at an angle to each other so as to form generally V-shaped bearing surfaces, it being noted that the pair of bearing surfaces 44, 46 extend in a direction opposite to the pair of bearing surfaces 48, 50.

Figure 4:
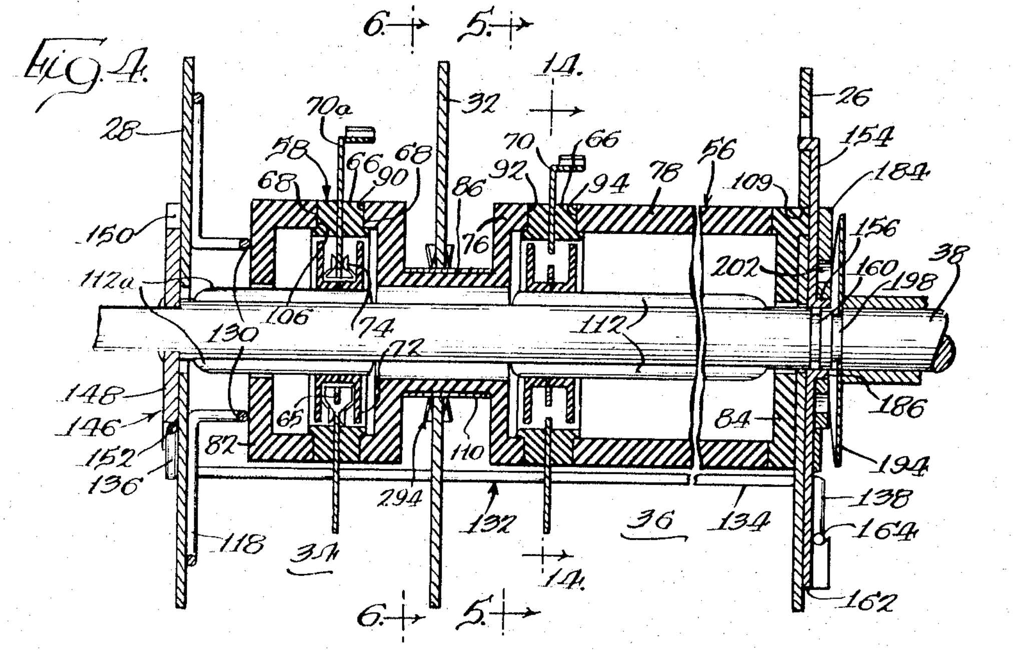
FIG. 4 is a partial sectional plan view of the improved tuner taken along line 4—4 of FIG. 1.
Figure 5:
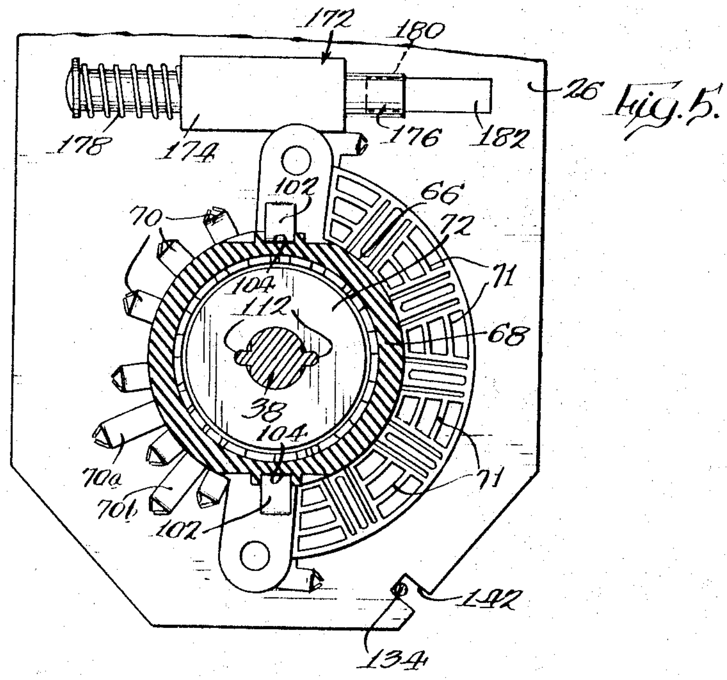
FIG. 5 is a partial sectional view of the improved tuner taken along line 5—5 of FIG. 4.
Figure 6:
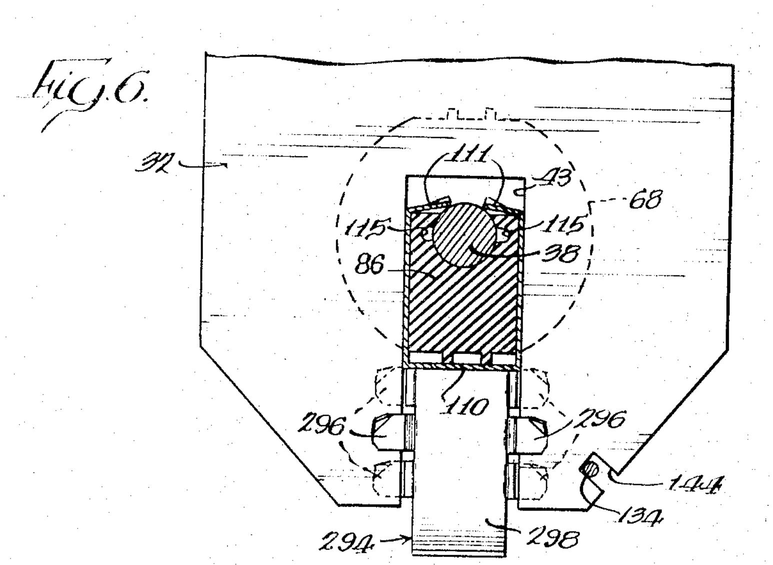
FIG. 6 is a partial sectional view of the improved tuner taken along line 6—6 of FIG. 4.

Before considering the manner in which the shaft 38 is held against the bearing surfaces 44, 46 and 48, 50, reference will be made to the tuner switch assembly which is actuated by the shaft 38. This switch assembly is shown generally at 56 and includes a plurality of switch wafers 58, 60, 62 and 64. Each of the switch wafers includes a stationary outer portion 66 (as best illustrated in FIGS. 4 and 5) in which are embedded a plurality of blade-type stator contacts 70. The stator portion 66 of each switch wafer is provided with annular seats or end surfaces 68. A metallic annular stator ring 65 (FIG. 14) is supported within the center opening of each stator member 66 by means of a plurality of supporting webs 67 which are partially embedded in the member 66 but are not connected to any of the stator terminals 70. However, two of these web portions **67*a* and 67*b* are connected to two relatively long stator terminals 70*a* and 70*b* respectively, so as to permit external connections to be made to the stator ring 65. A two-piece rotor 72 of insulating material is positioned within the opening in the stator 66 and a pair of clip type rotor contacts 69*a* and 69*b* which are electrically and mechanically connected together, are positioned between the opposed halves of the rotor 72 in such manner that they are rotatable therewith. The rotor clip 69*a* is adapted to engage the stator ring 65 for all positions of the rotor whereas the rotor clip contact 69*b* is adapted to engage successive ones of the inwardly directed blade type end portions of the stator contacts 70** as the rotor is rotated.

Preferably, the stator 66 is of molded construction wherein a partially stamped sheet metal member, in which the areas covered by the insulated portion of the stator are moved, is assembled to the insulated material of the stator by a suitable molding operation after which the remaining portions of the sheet metal member are cut away so as to provide the individual stator contacts shown. It will also be noted that for high frequency television channels the incremental inductances may also be in the form of stamped metal portions 71 which may be produced in the stator stamping operations and may be bent outwardly out of the plane of the stator contacts as desired to provide for alignment of the tuner to individual high frequency television channels. For a more detailed description of such a sheet metal stamped switch construction, reference may be had to an application of Alarico A. Valdettaro, Joe G. Badger and Stanley R. Meadows, Ser. No. 765,138, filed Oct. 3, 1958, now abandoned, and its continuation application Ser. No. 337,038 filed Jan. 10, 1964, and assigned to the same assignee as the present invention. It will also be understood that the stator contacts for the lower frequency channels, i.e., the stator contacts shown extending from the lefthand section of the stator in FIG. 5, are arranged to have incremental coil type inductances connected therebetween so as to provide for incremental tuning to the different low frequency television channels.

In order to space the switch member 58, 60, 62 and 64 and to provide an enclosure for the contact area of the switch members, the switch assembly 56 is provided with a plurality of generally cylindrical spacers 76, 78 and 80 of insulating material and a pair of cylindrical end spacers or end enclosures 82 and 84 of similar material to form a column of alternate spacers and wafers. One of the spacers 76 separates the switch wafer 58 in the section 34 of the tuner and the switch wafer 60 in the section 36 of the tuner 20 which are isolated by the partition 32.

To provide for passage of the spacer 76 through the shield 32 the shield 32 is provided with a slot 43 (FIG. 6), and the spacer 76 includes an intermediate portion 86 of generally rectangular cross section positioned in the slot 43 and axially slidable relative thereto.

Figures 7, 8, 10:
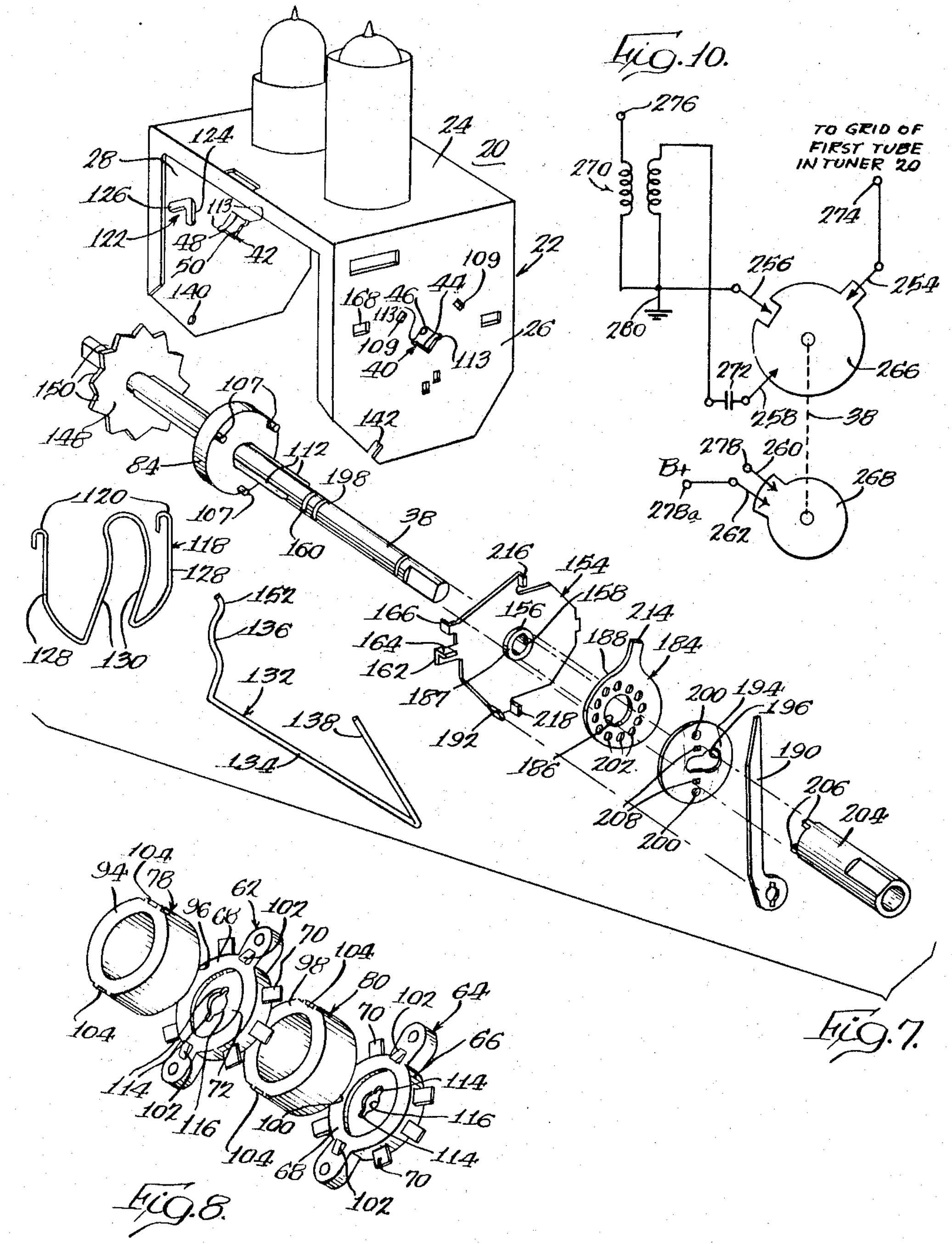
FIG. 7 is a partial exploded view of the improved tuner illustrating the shaft and bearing assembly and the fine tuning assembly.
FIG. 8 is a partial exploded view of the tuner switch assembly.
FIG. 10 is a schematic diagram of a UHF switch subassembly which may be employed with the tuner of FIG. 1.

In order to align the elements of the switch assembly 56 the spacers 76, 78 and 80 each have a pair of outer cylindrical peripheral portions 90 and 92, 94 and 96, and 98 and 100, respectively, at each end cooperable with the stator faces 68 of the adjacent switch wafers 58, 60, 62 and 64, as best seen in FIGS. 1 and 8. The end spacers 82 and 84 are each provided with a single outer cylindrical peripheral portion 106 and 108 respectively, which cooperate with one of the outer faces 68 of the switch wafers 58 and 64, respectively. Moreover, each of the switch wafers 58, 60, 62 and 64 is provided with a wedge-shaped projection 102 (FIGS. 1, 5 and 8) on each side thereof which cooperates with longitudinally extending grooves 104 formed in the periphery of the spacers 76, 78, 80, 82 and 84 to align and position the switch wafers and spacers relative to each other. One end cap 84 is provided with a plurality of studs 107 (FIG. 7) on its outer side which cooperate with a plurality of apertures 109 in the end wall 26 to align the switch assembly 56 relative to the chassis 22 and to prevent the same from rotating upon rotation of the shaft 38. It will also be noted that the positive registration of switch wafers and spacers by means of the projections 102 and groove 104 insures correct alignment of the switch contact of each wafer relative to the main tuning shaft. In conventional wafer switch construction in which the wafers are spaced by means of studs extending between the ear portions of adjacent wafers, the wafers may become twisted relative to one another when the switch assembly is supported only from the front of the tuner chassis. This is particularly objectionable in relatively long assemblies wherein it is necessary to register the rear end of the switch assembly as well as the front end. However, with the construction of the present invention positive alignment of the switch wafers is insured although the switch column may contain many wafers and is registered only with respect to the front end of the tuner chassis. In this manner a completely enclosed column switch assembly is provided. Also, a suitable tarnish retardant, in the form of crystals, paste, impregnated paper, or the like, may be positioned within these spacers so that the rotor and stator contacts of the switch wafers, which are normally silver plated, will not become tarnished. For example, a piece of paper impregnated with a sulphide absorbing material such as an antimony salt, may be positioned within the spacers to prevent the switch contacts from being tarnished. In the alternative, small spheres of naphthalene or other suitable material having a high vapor pressure may be positioned within the spacers so that they will fill the space within the spacers with an inert vapor and thus prevent contamination of the contacts by contact with the atmosphere.

Since the partition 32 is slotted to receive the intermediate portion 86 of the spacer 76, it is necessary to provide conductive means for bridging this slot so as to provide the proper isolation between the sections 34 and 36 of the tuner. It is also necessary to establish a conductive connection between the partition 32 and the shaft 38 so as to prevent current from flowing through the shaft and thus causing undesired interaction between the sections 34 and 36. To this end a conductive sheet metal clip 110 is positioned around the intermediate portion 86 of the spacer 76 in such manner that the outer edges of the clip 110 are in good electrical contact with the edges of the slot 43 in the partition 32. The end portions 111 of the clip 110 are turned inwardly so that the tips of these end portions bear upon the exposed upper surface of the shaft 38. Accordingly, this shaft is electrically connected to the partition 32 so as to prevent ground currents from flowing through this shaft between the compartments 34 and 36. In addition, a removable partition member 294 is provided with spring fingers 296 which engage the edges of the partition 32 adjacent the slot 43 so that a good conductive ground shield is normally provided across this slot. The removable partition 294 is also provided with a curved portion 298 which is adapted to engage the cover of the tuner so as to provide a good electrical connection between the partition 32 and the cover of the tuner during normal operation thereof.

In order to rotate all of the rotor portions 72 of the switch wafers 58, 60, 62 and 64 in unison to the desired channel positions, the main tuning shaft 38 extends entirely through the switch assembly 56 and engages each of the rotor portions 72. More particularly, the portion of the control shaft 38 in contact with the switch wafers 60, 62 and 64 is provided with splines 112 (FIG. 4) so as to permit the shaft 38 to be readily removed while at the same time providing a positive means for angularly driving the switch rotors 60, 62 and 64 to the selected positions. A similar pair of splines 112*a* are provided for driving the rotor of the switch wafer 58. However, it will be noted that the splines 112 and 112*a* do not extend to the bearing areas of the shaft 38 but instead cylindrical areas are provided for bearing surfaces which are urged into engagement with the V-shaped bearing surfaces 44, 46 and 48, 50. The splines 112 and 112*a* are arranged to engage the notches 114 in the central bore 116 of each switch rotor (as best illustrated in FIG. 8). Also, corresponding notches 113 are provided in the end plates 26 and 28 of the tuner chassis so as to permit the shaft 38 to be readily withdrawn from the tuner without removing the switch assembly 56 from the chassis 22. The spacer 76 is also provided with notches 115 in the central bore thereof so as to permit withdrawal of the shaft 38. However, the splines 112 and 112*a* do not extend into the area of the shaft 38 which is engaged by the spring end portions 111 of the grounding clip 110 so that good electrical contact is maintained between the shaft 38 and the partition 32 as this shaft is rotated. The main tuning shaft 38 is provided with a channel selector knob 117 (shown in phantom in FIG. 1) to provide for manual positioning of the switch wafers of the tuner to the desired channel position.

In order to maintain the switch assembly 56 in its assembled position, the switch wafers 58, 60, 62 and 64, the plurality of spacers 76, 78 and 80, and the end enclosures 82 and 84 are biased together by resilient spring means. In the illustrated embodiment, the biasing means comprises a torsion spring 118 (FIGS. 1, 4 and 7) which reacts between one end wall 28 of the chassis 22 and one end enclosure 82 of the switch assembly, the other end cap 84 of the switch assembly bearing against the other end leg 26 of the chassis 22 so that the switch assembly is resiliently compressed between the chassis 22 and the torsion spring 118. The torsion spring 118 includes a pair of hook portions 120 which are engageable in a pair of outwardly extending angle openings 122 in the leg 28. The angle openings 122 have a vertical leg 124 and a horizontal leg 126 (FIGS. 3 and 7) so that the hook portions 120 may be positioned in the vertical legs 124 when the hook portions 120 are prestressed toward each other, and the natural resiliency of the torsion spring 118 moves the hook portions 120 outwardly from each other to engage and secure the torsion spring 118 in the horizontal legs 126. Moreover, the torsion spring 118 includes a first pair of legs 128 which bear against and are positioned by the end leg 28 of the chassis 22, and a second pair of legs 130 which extend generally axially outwardly from the first pair of legs 128 to form a generally V-shaped spring in elevational view, the spring being prestressed when installed between the end leg 28 and the end enclosure 82 of the switch assembly thereby resiliently compressing the switch assembly 56. The torsion spring 118 is effective to compress the switch assembly 56, but does not transmit any load to the selector control shaft 38. Moreover, because of the slidable relation between the intermediate portion 86 of the spacer 76 and the partition 32, the switch assembly 56 is compressed as a unit without restraint by the partition 32.

In order to bias the shaft 38 against the bearing surfaces 44, 46 and 48, 50, there is provided a torsion bar type spring shown generally at 132 which includes a center or bight portion 134 and a pair of end portions 136 and 138. The torsion spring 132 is positioned in the chassis 22 of the tuner 20 by locating means in the legs of the chassis; namely, by means of an opening 140 in the end leg 28 of the chassis 22, a slot 142 in the end leg 26 of the chassis 22 and a slot 144 in the partition 32. An index wheel 148 is secured to the main tuning shaft 38 and is positioned adjacent the rear surface of the leg 28 of the tuner chassis. The end portion 136 of the torsion bar spring 132 is provided with a V-shaped band 152 (FIG. 3) which is adapted to ride against the periphery of the index wheel 148 and is biased into the peripheral notches 150 of the index wheel so as to perform a detent function in locating and positioning the main tuning shaft 38 in the desired angular positions representing the assigned television channels. The forward arm 138 of the torsion bar spring 132 is adapted to engage a hook portion 164 formed on an arm 162 of a retaining plate 154. Initially the arms 136 and 138 of the torsion bar spring 132 are inclined at an angle relative to one another as is best illustrated in FIG. 7. The torsion bar spring 132 is first positioned in the opening 140 in the rear leg 28 and is then positioned within the slots 142 and 144. In its unstressed condition the arm 138 of the spring 132 occupies the position shown in dotted lines in FIG. 2. However, when the arm 138 is moved into engagement with the shoulder 164 the V-shaped bend 152 of the arm 136 is moved into engagement with one of the notches on the index wheel 148 and also biases the main tuning shaft 38 against the V bearing surfaces 48 and 50. At the same time, the bias exerted by the end portion 138 of the spring 132 functions to urge the plate 154 to the left, as viewed in FIG. 2. The plate 154 is provided with a raised portion or boss 156 having an eccentrically located opening or bore 158 therethrough. The plate 154 is positioned over the main tuning shaft 38 so that an inner edge of the boss 156 adjacent to the opening 158 will engage a circumferential groove 160 in the shaft 38. Accordingly, the bias placed on the retaining plate 154 by means of the torsion bar spring 132 also forces the forward bearing portion of the main tuning shaft 38 against the V bearing surfaces 44 and 46. It will thus be evident that the spring 132 performs the dual function of maintaining both ends of the main tuning shaft 138 against their respective V bearing surfaces and at the same time provides a detent action for the main tuning shaft 38 by virtue of the engagement of the bend 152 with the notches on the index wheel 148. It will also be noted that the spring 132 may be readily removed by merely disengaging the arm 138 thereof from the lug 164 so that the spring 132 is disengaged from the index wheel 148 and may then be readily removed so that the shaft 38 itself can be removed from its associated switch structure. It will be noted that the main tuning shaft 38 may be made to extend from either end of the tuner insofar as the switch actuating function thereof is concerned.

Figure 2:
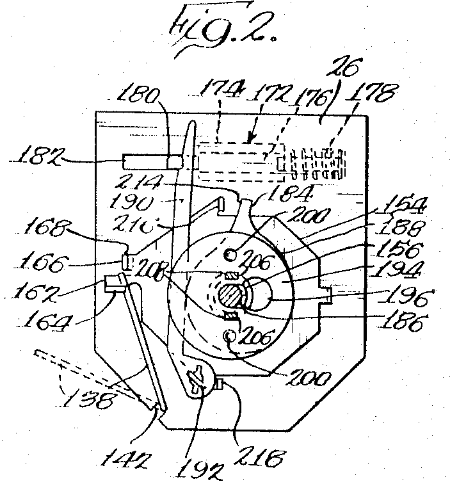
FIG. 2 is a partial righthand sectional view of the tuner of FIG. 1 taken along line 2—2 thereof.
Figure 3:
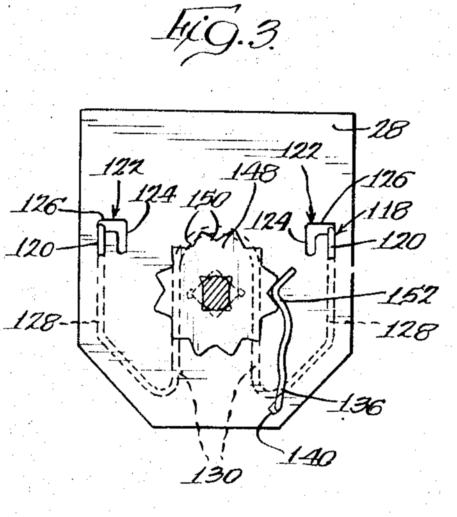
FIG. 3 is a partial left side sectional view of the improved tuner taken along line 3—3 of FIG. 1.

The retaining plate 154 is also provided with a rearwardly extending arm 166 which is adapted to fit into a positioning hole 168 in the end leg 26 of the tuner chassis and it will be noted that when the plate 154 is biased to the left in FIG. 2 by means of the torsion bar spring 132 the plate 154 is held in engagement with the groove 160 of the main tuning shaft 38 so that this tuning shaft is secured against axial movement. In the embodiment of FIGS. 1 to 8, inclusive, the retaining plate 154 also functions as a portion of the fine tuning arrangement of the tuner now to be described. However, it will be understood that a suitable spring retaining member may be employed instead of the retaining plate 154, as will be described in more detail hereinafter in connection with the embodiment of FIG. 9.

Referring now to the fine tuning mechanism of the tuner in FIGS. 1 to 8, inclusive, the fine tuning element of the present invention, which may comprise any suitable variable reactance, is illustrated as a variable inductance 172 which may be connected into the circuit of the oscillator portion of the tuner so as to provide a small variation in frequency of the oscillator in each of the television station positions of the main tuning shaft 38, as will be readily understood by those skilled in the art. The inductance 172 comprises a winding 174 having a movable core 176 which is biased into the winding 174 by means of a compression spring 178. The movable core 176 is provided with a finger 180 which extends through a slot 182 in the end leg 26 of the tuner chassis.

In order to provide a manually actuable control for the inductance 174, there is provided a cam member 184 (FIGS. 2 and 7) having an eccentrically located bore 186 which is adapted to be seated on the outer edge or peripheral bearing surface 187 (FIG. 7) of the boss 156. Although the bore 158 through the boss 156 is eccentric with reference to the boss, the eccentricity of the bore 158 is equal to the depth of the groove 160 so that when the retaining plate 154 is biased into the groove 160 of the shaft 38 by the torsion bar spring 132, the bearing surface 187 on the boss 156 is concentric with the axis of the control shaft 38. The cam member 184 thereby rotates concentrically about the shaft 38. The cam member 184 is provided with a cam surface 188 on its edge. A cam follower 190 is pivotally mounted on an extension 192 on the retaining plate 154 and rides against the cam surface 188. The other end of the cam follower 190 engages the finger 180 on the movable core 176 so that rotation of the cam member 184 is effective to pivot the cam follower 190 and to position the movable core in the inductance winding 174 against the restraint of the return bias of the compression spring 178. The positioning of the cam member on the stationary boss 156 of the retaining plate 154 minimizes any tendency of the fine tuning adjustment to move during manual adjustment of the selector control shaft 38 during selection of the desired television receiving channel. Moreover, the arrangement provides a very narrow, flat, fine tuning mechanism adapting the tuner for installations in shallow television sets.

To prevent manually forcing the fine tuning mechanism beyond its limits, there is provided a friction drive including detent means which permits slippage between the cam member 184 and the manual control. Specifically, there is provided a detent member or plate 194, which also acts as a retaining member for the parts 154 and 184 and is retained on the control shaft 38 through engagement of the edges of the plate 194 adjacent a slot or hairpin type opening 196 therein with a second circumferential groove 198 on the main tuning shaft 38. The detent member 194 is provided with a pair of detent lobes 200 which simultaneously engage an opposed pair of a plurality of complementary detent openings 202 in the cam member 184. Concentric with the control shaft 38 is an outer fine tuning shaft 204 having a pair of fingers 206 at its inner end which engage the detent member 194 for rotation thereof through a pair of drive openings 208. A fine tuning control knob 210 (shown in phantom in FIG. 1) is secured to the outer shaft 204 to provide for manual control of the shaft 204. In order to limit the angular travel of the cam member 184, the cam member 184 is provided with a limit arm 214 adapted to engage a pair of stop arm extensions 216 and 218 on the retaining plate 154.

In operation, rotation of the fine tuning control knob 210 drives the cam member 184 through the detents 200 on the detent member 194 until the cam member 184 reaches one of its limiting positions with the limit arm 214 against one of the stop arm extensions 216 or 218. Continued rotation of the fine tuning control knob 210 causes the detents 200 to slip from the detent openings 202 and to advance to the next pair of detent openings. In this manner, there is provided a friction drive between the fine tuning control knob 210 and the cam member 184 to prevent overloading of the cam member and fine tuning mechanism by a manual attempt to turn the fine tuning control knob 210 beyond its limiting positions.

In order to take up the end play in the main tuning shaft 38, there are provided means which cooperate with the control shaft 38 to bias the control shaft 38 against axial movement. For this purpose the detent member 194 is formed of spring metal and is bowed outwardly at the center thereof, as best illustrated in FIG. 1, so that the central portion of the detent member 194, which is engaged in the second groove 198 of the shaft 38 through the slot 196, is biased outwardly from the end leg 26 of the chassis. The index wheel 148 is thereby biased inwardly against the outer surface of the end leg 28 to resiliently hold the selector control shaft 38 in a fixed axial position with no end play.

Figure 9:
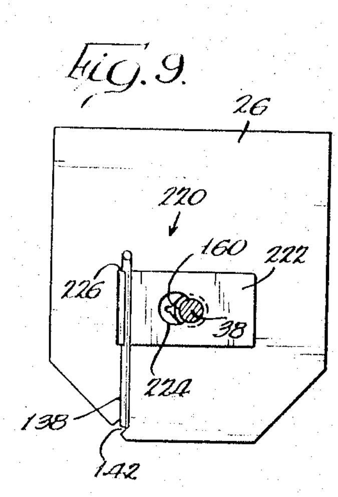
FIG. 9 is a righthand view of another embodiment of a tuner according to the present invention and illustrating a modified means for retaining the main tuning shaft within the chassis.
Figure 14:
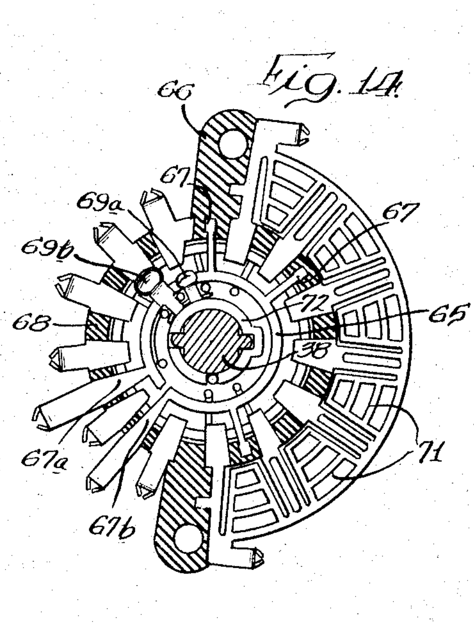
FIG. 14 is a sectional view taken along the line 14—14 of FIG. 4.

In the event that it is desired to use a different form of fine tuning arrangement, the embodiment of FIG. 9 may be employed wherein a different arrangement is employed to retain the torsion bar spring 132 and to prevent end play of the main tuning shaft 38. Referring to this figure, there is provided in this embodiment a retaining plate 222 which takes the place of the retaining plate 154 and is provided with a slot or hairpin type opening 224 which is adapted to be received in the groove 160 in the main tuning shaft 38. The retaining plate 222 has one edge portion bent into a reverse bend to form a hook 226 which is adapted to receive the end portion 138 of the torsion bar spring 132. When the end portion 138 is positioned behind the hook 226, the plate 222 is biased into the groove 160 of the main tuning shaft 38 and also functions to bias the shaft 38 against the V-shaped bearing surfaces 44 and 46. The retaining plate 222 is made of spring metal and is bowed outwardly at the center thereof so as to apply axial force to the main tuning shaft 38 and thereby hold the index wheel 148 against the end portion 28 of the tuner chassis so that end play of the main tuning shaft 38 is minimized. In the embodiment of FIG. 9 it will be understood that any suitable form of fine tuning arrangement, such as a conventional fine tuning capacitor, or the like, may be employed, the retaining plate 222 in the embodiment of FIG. 9 functioning solely in connection with the torsion bar spring 132 and the main tuning shaft 38.

In FIGS. 10, 11, 12 and 13 of the drawings there is illustrated a UHF switch subassembly 250 which is adapted to be employed in the tuner of FIGS. 1 to 8, inclusive, in the event that this tuner is to be adapted to receive signals from a preceding UHF tuner during reception in the UHF television band. For UHF reception it is common practice today to provide the main tuning shaft of the VHF tuner with a position for UHF reception in which position the RF amplifier and mixer stages of the VHF tuner are operated as IF amplifiers. Such an arrangement is shown, for example, in U.S. Letters Patent No. 2,665,377 which issued on January 5, 1954. In such a television tuning arrangement, the UHF tuner produces an IF signal which is supplied to the VHF tuner when the main tuning shaft of the VHF tuner is in the UHF position. In addition, it is necessary to supply a suitable energizing potential to the preceding UHF tuner when the main tuning shaft of the VHF tuner is in the UHF tuning position. In accordance with the present invention, the switch structure retaining spring 118 of the tuner of FIGS. 1 to 8, inclusive, may be replaced by a UHF switch subassembly 250 wherein all of the necessary switching for receiving an IF signal from a preceding UHF tuner is accomplished. The VHF tuner may thus be readily adapted for UHF reception without providing the UHF switching contacts on the VHF tuner itself. Accordingly, the VHF tuner may be manufactured without the UHF switching included and this switching may be readily inserted in place of the switch retaining spring 118 when the tuner is to be adapted for UHF reception.

The UHF switch subassembly 250 includes a body member 252 which acts as the stator portion of the switch subassembly and has a plurality of fixed clip type contacts 254, 256 and 258 secured to one side thereof and a second plurality of fixed contacts 260 and 262 secured to the opposite side thereof. The UHF switch subassembly 250 further includes a rotor portion 264 having a first contact ring 266 adapted to engage the first plurality of fixed contacts 254, 256 and 258, and having a second contact ring 268 adapted to engage the second plurality of fixed contacts 260 and 262. Mounted on the stator portion 252 of the UHF switch subassembly 250 is a coupling transformer 270 and a capacitor 272. The transformer 270 can be tuned at the factory or in the shop by adjustment of a core 273 (FIG. 11) in the body of the transformer 270. An insulated I.F. signal input terminal 276 is also carried by the portion 252 as is an I.F. output terminal 274. Also, the stator contacts 260 and 262 are connected to the B+ terminals 278 and **278*a* which project from a boss 279 formed in the portion 252. A spring finger 280 is provided for grounding the fixed contact 256 to the leg 28 of the chassis 22 when the UHF subassembly 250** is positioned in the tuner.

Referring now to the schematic diagram of FIG. 10, the UHF subassembly is therein shown schematically with the control shaft 38 in its UHF position. In this position an input I.F. signal supplied from the preceding UHF tuner will be connected by way of the terminal 276 to the primary winding of the transformer 270 so that this I.F. signal appears across the secondary winding of this transformer. The I.F. signal appearing across this secondary winding will be coupled through the condenser 272, the fixed contact 258, the rotor blade 266 and the fixed contact 254 to the terminal 274. The terminal 274 is arranged to be connected to a pin type terminal 281, which is mounted on and insulated from the deck 24 of the chassis 22, when the subassembly 250 is inserted into the tuner chassis. The terminal 281 is in turn connected to the grid of the first tube in the VHF tuner so that when the main tuning shaft 38 is in the UHF position an I.F. signal will be supplied to this grid. At the same time a B+ energizing potential, which is connected permanently to the terminal **278*a*, is supplied from the VHF tuner by way of the terminal 278*a*, the fixed stator contact 262, the rotor blade 268, the stator contact 260, and the terminal 278 to the UHF tuner so that this tuner is energized for UHF reception. When the main tubing shaft 38 is in any one of the VHF channel positions the switch rotor 266 connects the stator contact 258 to the stator contact 256, this latter contact being connected to ground through the spring grounding member 280. Accordingly, the secondary winding of the coupling transformer 270 is shorted out in all of the VHF positions so that no undesired signals are produced in this transformer during VHF reception and the contact 254 is disconnected from the rotor 266. Also, when the shaft 38 is in any one of the VHF positions the terminals 278 and 278*a*** are disconnected so that no B+ energizing potential is supplied to the preceding UHF tuner.

In order to provide for control of the UHF switch wafer 250 by the control shaft 38, the rotor portion 264 thereof is provided with an opening 282 (FIG. 12) having a pair of oppositely disposed recesses or keyways 284 similar to those in the switch wafers 58, 60, 62 and 64, and complementary to the splined shaft 38 so that the recesses 284 are engageable by the oppositely disposed splines **112*a* on the shaft 38**.

Figures 11, 12:
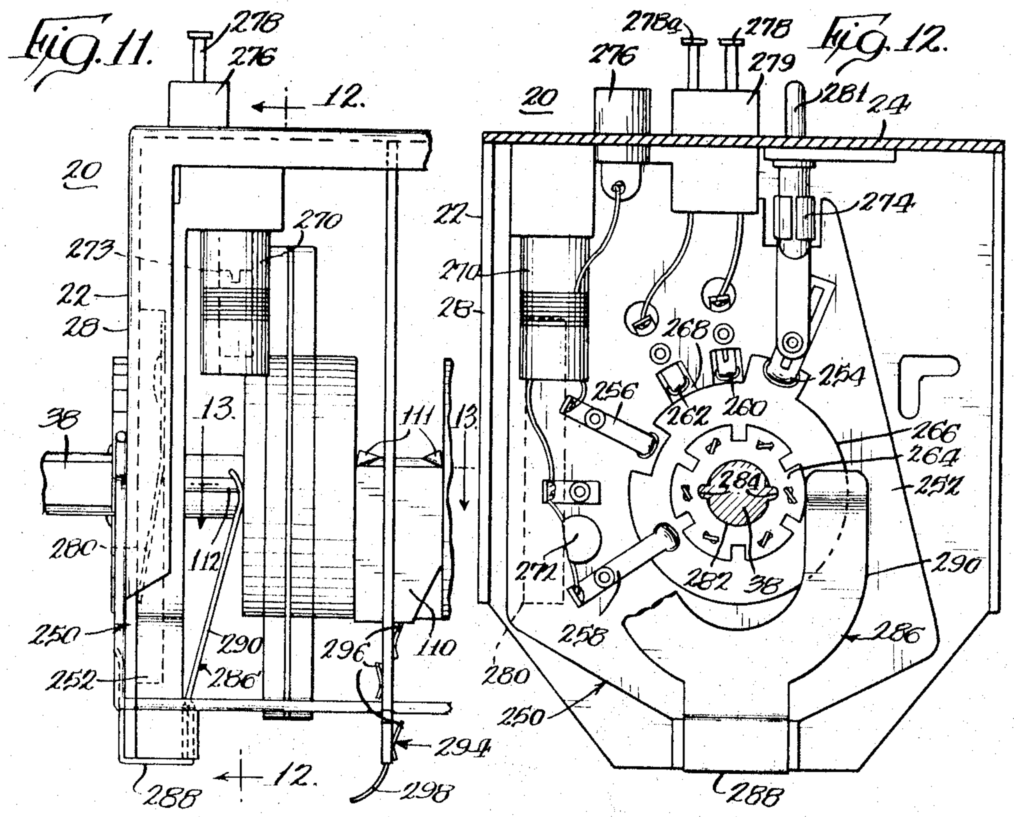
FIG. 11 is a partial sectional elevational view of the improved tuner of FIG. 1 with the addition of the UHF switch subassembly shown schematically in FIG. 10.
FIG. 12 is a right side sectional view taken along line 12—12 of FIG. 11.
Figure 13:
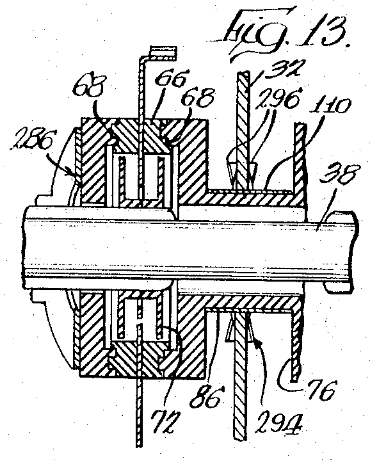
FIG. 13 is a partial plan sectional view taken along line 13—13 of FIG. 11.

To retain the UHF switch subassembly 250 between the switch assembly 56 and the end leg 28 of the chassis 22, the torsion spring 118 which compresses the switch assembly 56 is replaced by a yoke-shaped leaf spring 286 (FIGS. 11 and 12). One end of the UHF switch wafer 250 is clamped to the end leg 28 by a generally U-shaped portion 288 provided on the leaf spring 286; the other end of the UHF switch wafer 250 is positioned in the bight portion 24 of the chassis by the insulated I.F. terminal 276 and the boss portion 279 in which the terminals 278 and 278*a* are embedded, which portions extend through suitable apertures in the bight portion 24. The leaf spring 286 further contains a yoke or Y-shaped arm 290 which bears against the switch assembly 56 to react between the end leg 28 and the switch assembly 56 to compress the switch assembly 56 into the enclosed column switch.

To assemble the UHF switch subassembly 250 in the tuner 20 either during the initial assembly at the factory or in the field, the control shaft 38 is removable from the tuner 20, including the chassis 22 and the switch assembly 56, by release and removal of the torsion bar spring 132 so as to free the index wheel 148, and release of the retaining plate and fine tuning mechanism at the other end of the shaft 38. The control shaft 38 may then be axially withdrawn from the tuner 20 by axial movement to the left, as viewed in FIG. 11; the splines 112 and 112*a* being withdrawn from the recesses 114 in the rotor portions 72 of the switch wafers. With the torsion spring 118 disassembled from the tuner 20, the UHF switch subassembly 250 may be installed in the tuner 20 by mere insertion of the UHF switch wafer 250 into the space between the switch assembly 56 and the end leg 28. The leaf spring 286 is inserted to retain the UHF switch wafer 250 and to compress the switch assembly 56 and the control shaft 38 is thereafter inserted with the splines 112 and 112*a* thereof cooperating with the recesses 284 in the UHF wafer 250 and the recesses 114 on the rotor portions 72 in the switch assembly 56.

While preferred embodiments of the invention have been described by way of illustration, many modifications will occur to those skilled in the art. It is, therefore, to be understood that the appended claims cover all such modifications as fall within the true spirit and scope of the invention.

What is claimed as new and desired to be secured by Letters Patent of the United States is:

1. In a tuner, the combination of a chassis having a top wall and a pair of end walls extending generally perpendicularly to said top wall, a plurality of switch wafers each including a multi contact stator member and a rotor carrying contact means adapted selectively to engage said stator contacts as said rotor is rotated, said switch wafers being positioned between said end walls with the axes of the rotors thereof in alignment, a plurality of tubular spacer members interposed between said wafers and said end walls of said chassis to space said wafers relative to one another and to support said wafers from said chassis, and resilient means biasing said plurality of wafers and spacers against one of said end walls of said chassis.

2. The combination as set forth in claim 1 above and additionally providing means for interlocking said wafers and spacer members to prevent relative rotation therebetween.

3. The combination as set forth in claim 1 above and additionally including a shaft extending through the rotors of said switch wafers and the spacer means for operating the switch wafers.

4. In a high frequency tuner, the combination of a plurality of switch wafers each comprising a stator member and a rotor member, said stator members each comprising a plurality of flat conductive stator contacts embedded in and extending through an annular stator support member of insulating material and a flat conductive stator ring carried by said stator support member and positioned inside the inner ends of said stator contacts, each of said rotor members comprising a rotary member of insulating material having a shaft receiving opening at the center thereof and a conductive rotor clip carried by said rotary member and having a first pair of jaws adapted selectively to engage opposite sides of different ones of said stator contacts when the rotor member is rotated and having a second pair of jaws adapted continuously to engage opposite sides of said stator ring when the rotor member is rotated, each of said stator support members being provided with annular end surfaces on either side thereof, a plurality of spacer members interposed respectively between said switch wafers and having end surfaces adapted to engage said end surfaces of said stator support members, a shaft extending through said rotor members and said spacers, and means for maintaining said switch wafers and said spacers in assembled relation.

5. In a tuner, the combination of a chassis having a top wall and a pair of end walls extending generally perpendicularly to said top wall, a plurality of switch wafers each having an outer portion including stator contacts, and an inner rotor portion, and a plurality of tubular spacer members interposed between said wafers and between one of said switch wafers and one of said end walls, of said chassis, said spacer members engaging the outer portions of said switch wafers to provide a dust cover for the stator contacts and rotor of the switch wafers and to space the wafers relative to one another and to support the wafers from said one end wall of said chassis.

6. In a tuner, the combination of a chassis having a top wall and a pair of end walls extending generally perpendicularly to said top wall, a plurality of switch wafer members each comprising an outer stator member carrying a plurality of contacts and a rotor member adapted selectively to engage said stator contacts upon rotation of said rotor, a plurality of spacer members supporting and interposed between said wafer members to form a switch wafer and spacer assembly, a shaft extending through said rotors of said switch wafers and through said spacer members, a first cap means supported from said chassis and engaging one end of said assembly, a second cap means for engaging the other end of said assembly, and means for maintaining said wafer members, spacer members, said first cap means and said second cap means in assembled relationship to provide a dust shield for the contacts of said switch wafers disposed therein.

7. In a high frequency tuner, the combination of a chassis having a top wall and a pair of end walls extending generally perpendicularly to said top wall, a plurality of switch wafers each having a peripheral solid stator section and an inner section and including stator contacts and a rotor including rotor contacts, a plurality of fixed hollow spacers interposed respectively between and engageable with the peripheral solid portions of said switch wafers, a shaft supported from said end walls of said chassis and extending through the wafers and the spacers, a first cap supported from one of said end walls of said chassis and engageable with one of said spacers and coacting with said shaft, a second cap engageable with the peripheral portion of one of said wafers, and resilient means interposed between said other end wall of said chassis and said second cap maintaining said wafers and said spacers in assembled position thereby to cause the wafers to be supported from the chassis and spaced from one another by said spacers.

8. In a tuner, the combination of a U-shaped chassis having a bight portion and a pair of upstanding end legs, each provided with bearing means, an intermediate leg dividing said chassis into two sections and forming a shield between said sections and provided with shaft opening means, a plurality of switch wafers at least one of which is located in each of said sections, spacer members interposed between said switch wafers and portions of said chassis to space said wafers relative to one another and to support said wafers from said chassis, one of said spacer members passing through said shaft opening means, a control shaft extending through and operatively connected to said switch wafers and positioned for rotation in said bearing means, and resilient means coacting with said chassis and at least one of said spacer means for maintaining said wafers and said spacer means in assembled relation without transmitting any load to said shield.

References Cited by the Examiner

UNITED STATES PATENTS 2,862,088 11/1958 Mairs ______________ 338—154

ROBERT K. SCHAEFER, *Primary Examiner.*

J. R. SCOTT, *Assistant Examiner.*